United States Patent
Schwetlick et al.

(10) Patent No.: US 9,837,498 B2
(45) Date of Patent: Dec. 5, 2017

(54) STRIPE-SHAPED ELECTRODE STRUCTURE INCLUDING A MAIN PORTION WITH A FIELD ELECTRODE AND AN END PORTION TERMINATING THE ELECTRODE STRUCTURE

(71) Applicant: Infineon Technologies AG, Neubiberg (DE)

(72) Inventors: Werner Schwetlick, Groebenzell (DE); Robert Zink, Riegersdorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/166,957

(22) Filed: May 27, 2016

(65) Prior Publication Data

US 2016/0351668 A1 Dec. 1, 2016

(30) Foreign Application Priority Data

May 28, 2015 (DE) .................. 10 2015 108 440

(51) Int. Cl.
*H01L 29/40* (2006.01)
*H01L 29/66* (2006.01)
*H01L 29/739* (2006.01)
*H01L 29/423* (2006.01)
*H01L 29/10* (2006.01)
*H01L 29/78* (2006.01)
(Continued)

(52) U.S. Cl.
CPC ........ *H01L 29/407* (2013.01); *H01L 29/1095* (2013.01); *H01L 29/401* (2013.01); *H01L 29/408* (2013.01); *H01L 29/4238* (2013.01); *H01L 29/42368* (2013.01); *H01L 29/66734* (2013.01); *H01L 29/739* (2013.01); *H01L 29/7397* (2013.01); *H01L 29/7813* (2013.01); *H01L 27/0922* (2013.01); *H01L 29/0696* (2013.01)

(58) Field of Classification Search
None
See application file for complete search history.

(56) References Cited

U.S. PATENT DOCUMENTS 8,748,977 B2 * 6/2014 Kudou ................ H01L 29/4236
257/329
2003/0042549 A1 * 3/2003 Fujihira .............. H01L 29/0634
257/378
(Continued)

*Primary Examiner* — William Coleman
*Assistant Examiner* — Kien Ly
(74) *Attorney, Agent, or Firm* — Murphy, Bilak & Homiller, PLLC

(57) ABSTRACT

A semiconductor device includes a stripe-shaped electrode structure that extends from a first surface into a semiconductor portion. The electrode structure includes a main portion and an end portion terminating the electrode structure. The main portion includes a field electrode and a first portion of a field dielectric separating the field electrode from the semiconductor portion. The end portion includes a filled section in which a second portion of the field dielectric extends from a first side of the electrode structure to an opposite second side. The filled section is narrower than the main portion and a length of the filled section along a longitudinal axis of the electrode structure is at least 150% of a first layer thickness of the first portion of the field dielectric.

21 Claims, 14 Drawing Sheets

(51) Int. Cl.
 *H01L 29/06* (2006.01)
 *H01L 27/092* (2006.01)

(56) References Cited

U.S. PATENT DOCUMENTS

| | | | |
|---|---|---|---|
| 2006/0006386 A1* | 1/2006 | Hirler | H01L 29/404 257/60 |
| 2014/0008722 A1* | 1/2014 | Mariani | H01L 29/66666 257/334 |
| 2016/0064556 A1* | 3/2016 | Qin | H01L 21/26513 257/334 |

* cited by examiner

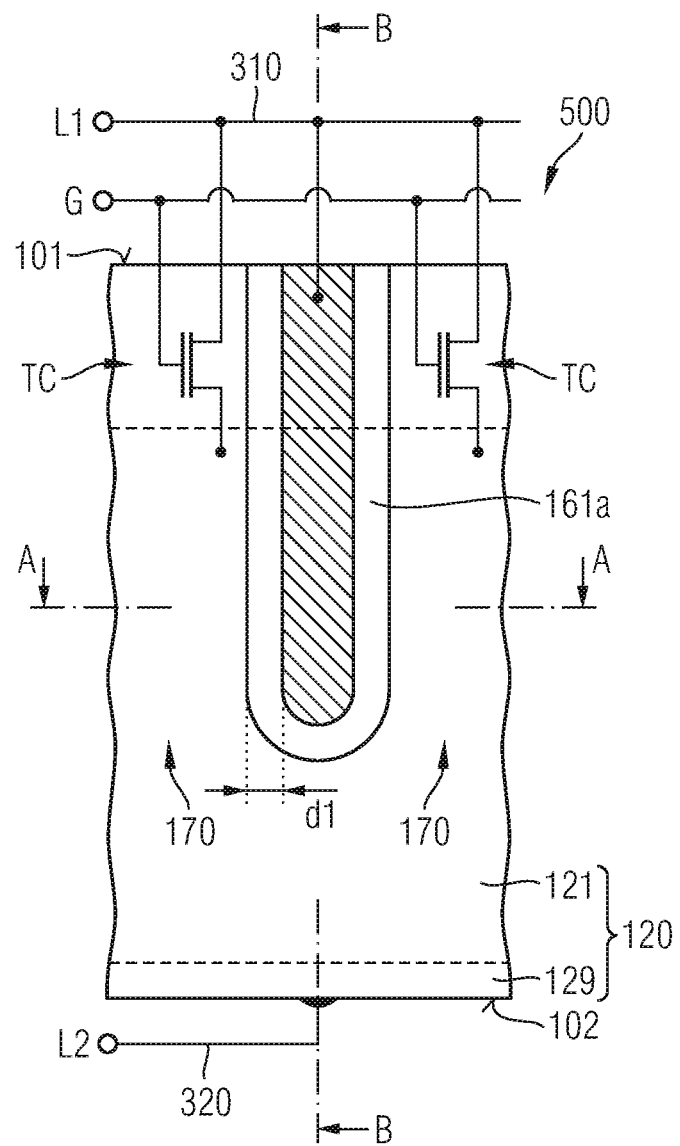

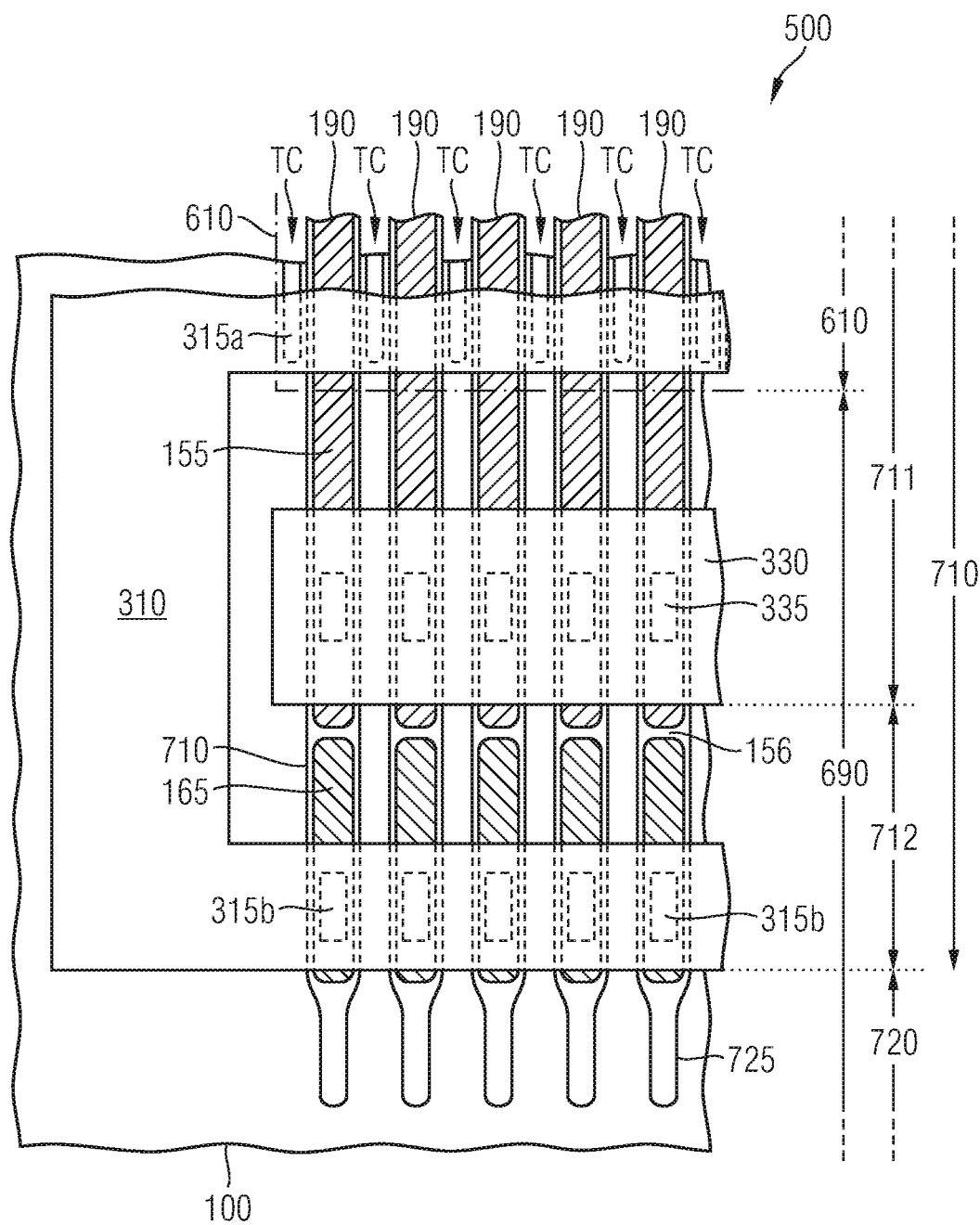

STRIPE-SHAPED ELECTRODE STRUCTURE INCLUDING A MAIN PORTION WITH A FIELD ELECTRODE AND AN END PORTION TERMINATING THE ELECTRODE STRUCTURE

PRIORITY CLAIM

This application claims priority to German Patent Application No. 10 2015 108 440.6 filed on 28 May 2015, the content of said application incorporated herein by reference in its entirety.

BACKGROUND

Power semiconductor devices such as IGFETs (insulated gate field effect transistors) as well as DMOS (diffused metal oxide semiconductor) portions of smart power semiconductor devices including both power transistor cells and logic circuits are typically based on transistor cells formed along stripe-shaped electrode structures which run through a transistor cell area. In an on-state a load current flows in a vertical direction through semiconductor mesas between the electrode structures. In a blocking mode the electrode structures deplete drift zone sections in the semiconductor mesas such that a high blocking capability can be achieved even at a comparatively high dopant concentration in the drift zone sections that in turn ensures a low on-state resistance RDSon of the transistor cells.

It is desirable to improve the reliability of power semiconductor devices.

SUMMARY

According to an embodiment a semiconductor device includes a stripe-shaped electrode structure that extends from a first surface into a semiconductor portion. The electrode structure includes a main portion and an end portion terminating the electrode structure. The main portion includes a field electrode and a first portion of a field dielectric separating the field electrode from the semiconductor portion. The end portion includes a filled section in which a second portion of the field dielectric extends from a first side of the electrode structure to an opposite second side. The filled section is narrower than the main portion and a length of the filled section along a longitudinal axis of the electrode structure is at least 150% of a first layer thickness of the first portion of the field dielectric.

According to another embodiment an electronic circuit includes a semiconductor device including a stripe-shaped electrode structure that extends from a first surface into a semiconductor portion. The electrode structure includes a main portion and an end portion terminating the electrode structure. The main portion includes a field electrode and a first portion of a field dielectric separating the field electrode from the semiconductor portion. The end portion includes a filled section in which a second portion of the field dielectric extends from a first side of the electrode structure to an opposite second side. The filled section is narrower than the main portion and a length of the filled section along a longitudinal axis of the electrode structure is at least 150% of a first layer thickness of the first portion of the field dielectric. The electronic circuit further includes a load electrically coupled to a load electrode of the semiconductor device.

According to a further embodiment, a method of manufacturing a semiconductor device includes forming a trench in a semiconductor layer, wherein the trench has a uniform first width in a main portion and a narrower second width in an end portion. A field dielectric is formed that includes first portions lining sidewalls of the trench in the main portion and filling a filled section of the end portion between a first side of the trench and a second, opposite side. A length of the filled section along a longitudinal axis of the trench is at least 150% of a first layer thickness of the first portions of the field dielectric.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1C is a schematic vertical cross-sectional view of the semiconductor device portion of FIG. 1A along line C-C orthogonal to the longitudinal center axis.

FIG. 5A is a schematic plan view of a portion of a semiconductor device according to an embodiment with gate contacts in a termination region.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
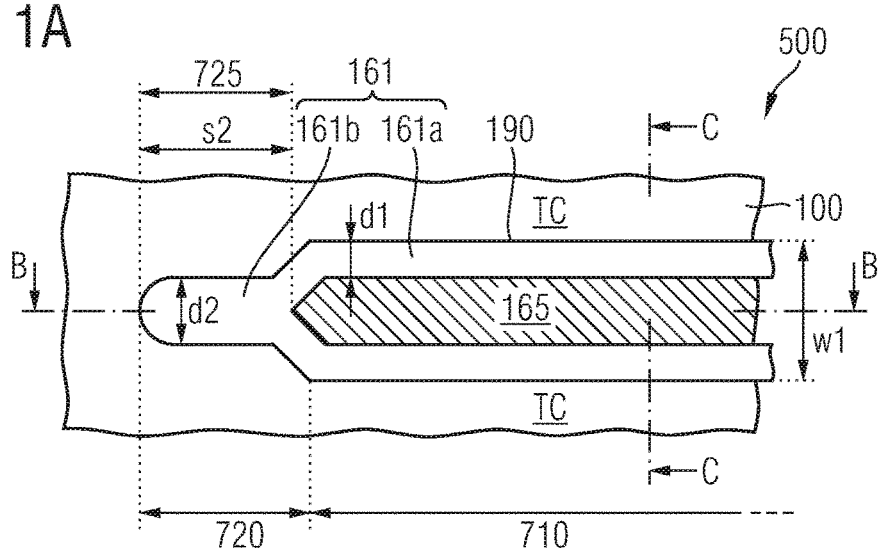
FIG. 1A is a schematic horizontal cross-sectional view of a portion of a semiconductor device according to an embodiment including a stripe-shaped electrode structure with a filled section in an end portion.
Figure 1B:
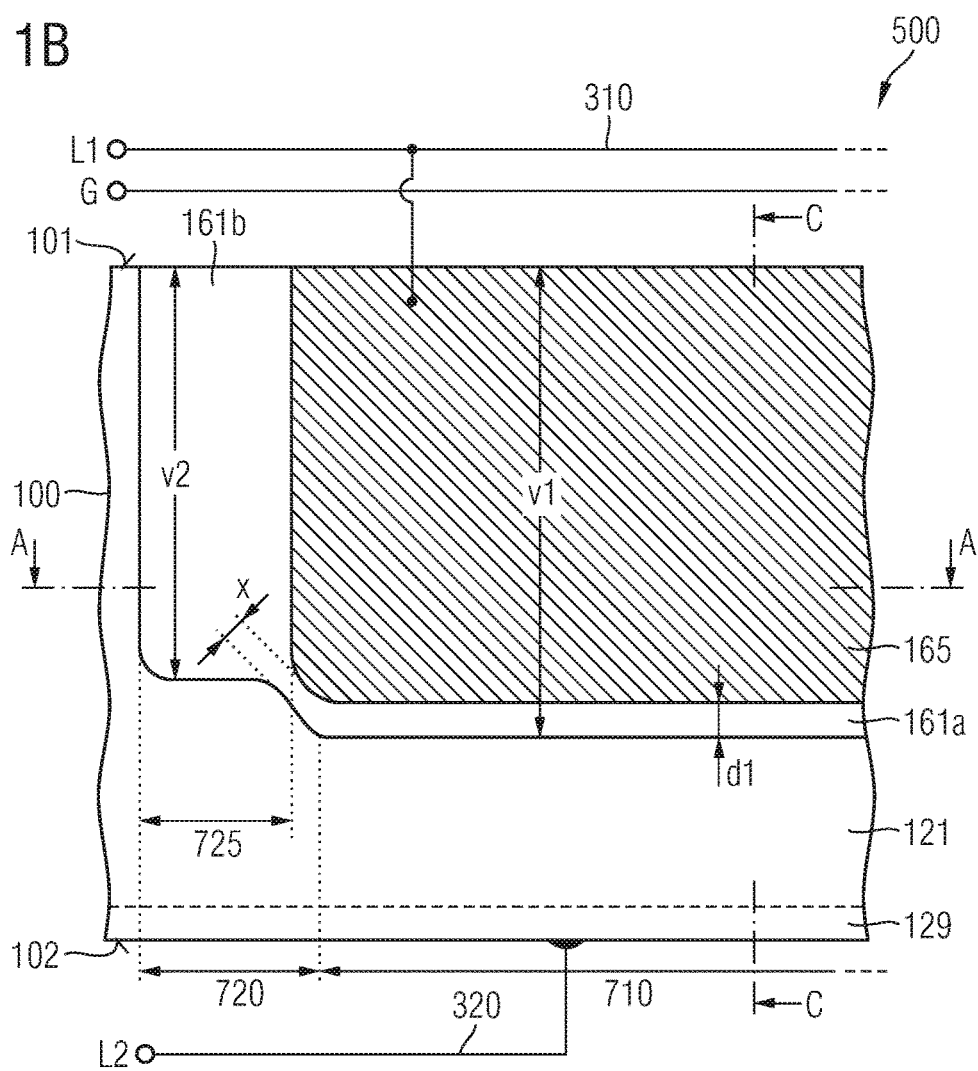
FIG. 1B is a schematic vertical cross-sectional view of the semiconductor device portion of FIG. 1A along line B-B coinciding with a longitudinal center axis of the electrode structure.

FIGS. 1A to 1C refer to a semiconductor device 500 including transistor cells TC. The semiconductor device 500 may be or may include an IGFET (insulated gate field effect transistor), for example an MOSFET (metal oxide semiconductor FET) in the usual meaning including FETs with metal gates as well as FETs with non-metal gates, an IGBT (insulated gate bipolar transistor), or an MCD (MOS controlled diode), by way of example.

The semiconductor device 500 is based on a semiconductor portion 100 from crystalline semiconductor material, such as silicon (Si), germanium (Ge), silicon germanium (SiGe), gallium arsenide (GaAs), any other $A_{III}B_V$ semiconductor or silicon carbide (SiC).

A first surface 101 of the semiconductor portion 100 may be approximately planar, may be given by a plane spanned by coplanar surface sections or may include staggered parallel surface sections. On the back, an opposite second surface 102 extends parallel to the first surface 101. A distance between the first surface 101 at the front side and the second surface 102 on the back depends on a blocking voltage the semiconductor device 500 is specified for and may be in the range of several μm to several hundred μm. The normal to the first surface 101 defines a vertical direction. Directions parallel to the first surface 101 are horizontal directions.

The transistor cells TC share a common drain structure 120 including a comparatively low doped drift zone 121 and a heavily doped contact layer 129 along the second surface 102. A potential applied to a gate terminal G, which is electrically connected to gate electrodes of the transistor cells TC, controls a load current flow between a first load electrode 310 at the front side and a second load electrode 320 on the back.

The first load electrode 310 may form or may be electrically connected or coupled to a first load terminal L1, which may be the anode terminal of an MCD, a source terminal of an IGFET or an emitter terminal of an IGBT. The second load electrode 320 may form or may be electrically connected or coupled to a second load terminal L2, which may be a cathode terminal of an MCD, a drain terminal of an IGFET or a collector terminal of an IGBT.

Stripe-shaped field electrode structures 190 extend from the first surface 101 into the semiconductor portion 100 and into the drift zone 121.

Along a longitudinal axis, each field electrode structure 190 includes a main portion 710 and end portions 720 terminating the electrode structures 190. The main portion 710 of the electrode structures 190 has a uniform first width w1 which may be in a range from 0.2 to 2 µm, for example in a range from 0.8 to 1.0 µm. A vertical extension v1 of the main portion 710 of the electrode structures 190 may be in a range from 1 to 10 µm, for example from 3 to 5 µm.

The main portion 710 includes a field electrode 165 as well as a first portion 161a of a field dielectric 161 that separates the field electrode 165 from the semiconductor portion 100. The field electrode 165 may consist of heavily doped polycrystalline silicon, metal-containing material or a combination thereof. The field electrode 165 may be electrically connected or coupled to one of the load electrodes of the semiconductor device, to a specific terminal, or to an output of an internal driver circuit. According to other embodiments, the field electrode 165 may float.

The first portion 161a of the field dielectric 161 may consist of a thermally grown dielectric, for example thermally grown silicon oxide, silicon nitride or silicon oxynitride, a deposited dielectric, for example silicon oxide deposited by CVD (chemical vapor deposition) using silane or TEOS (tetraethylorthosilicate) as precursor material, or a combination thereof. The first portion 161a of the field dielectric 161 is a highly conformal layer with a first layer thickness d1 in a range from 50 to 300 nm, for example in a range from 150 to 250 nm.

Each end portion 720 consists of or includes a filled section 725 that is narrower than the main portion 710. A mean width of the filled section 725 is smaller than the first width w1 of the main portion 710. In the filled section 725 a second portion 161b of the field dielectric 161 extends from a first side of the filled section 725 to a second side, wherein the first and second sides are on opposite sides of a longitudinal center axis of the electrode structure 190. The second portion 161b of the field dielectric 161 completely fills the filled section 725 between the first side and the second side. A length s2 of the filled section 725 along the longitudinal axis of the electrode structure 190 is at least 150% of the first layer thickness d1, e.g., at least 200% or at least 300%.

The second portion 161b of the field dielectric 161 may consist of a thermally grown dielectric, for example thermally grown silicon oxide, silicon nitride or silicon oxynitride, a deposited dielectric, for example silicon oxide deposited by CVD using silane or TEOS as precursor material, or a combination thereof.

The first and second portions 161a, 161b of the field dielectric 161 may have the same layer configuration including a thermally grown semiconductor dielectric, a deposited dielectric, or a combination thereof in the same order. According to other embodiments, the first portion 161a of the field dielectric 161 may be exclusively formed by a thermally grown layer and the second portion 161b may include a deposited semiconductor dielectric.

According to the illustrated embodiment a contour of the filled section 725 may include straight portions parallel to the longitudinal axis on both sides of a longitudinal center axis, wherein the mean width of the filled section 725 is approximately equal to a distance d2 between the two straight portions and at most w1−2*d1, e.g., at most 0.8*w1.

According to another embodiment, a contour of the end section 720 is devoid of straight portions parallel to the longitudinal axis and may steadily taper.

According to a further embodiment, the end section 720 includes further sections in addition to the filled section 725, wherein the further sections are not completely filled with the second portions 161b of the field dielectric 161 and may be wider than the filled section 725.

In a blocking state of the semiconductor device 500 a potential applied to the field electrodes 165 depletes portions of the drift zone 121 between neighboring electrode structures 190.

Since the electrode structures 190 are formed by etching a trench from the first surface 101 into the semiconductor portion 100 and since the depth of a recess is a function of the width of the recess, the resulting trench for the electrode structure 190 is deeper in the main portion 710 and shallower in the narrow portion 725. Accordingly, the first vertical extension v1 of the electrode structure 190 in the main portion 710 is greater than a maximum second vertical extension v2 in the filled section 725 as illustrated in FIG. 1B.

At a bottom of the electrode structures 190 a curvature of the field dielectric 161 between the main portion 710 and the end portion 720 is less pronounced than without the filled section 725. The greater curvature radius results in that the field dielectric 161 is more conformal even along the buried edge at the end of the main portion 710 such that a minimum thickness x of the field dielectric 161 in the region of the curvature deviates only to a low degree from the first layer thickness d1 of the field dielectric 161 in the main portion 710. The electric field strength distributes more uniform, peaks in the electric field strength along the curvature of the electrode structure 190 at the longitudinal end of the electrode structure 190 are reduced, and dielectric strength of the field dielectric 161 is increased. Avoiding local pinching of the field dielectric 161 allows for decreasing the target thickness of the field dielectric 161 and, due to the improved capacitive coupling to the drift zone 121, for a higher dopant concentration in the drift zone 121, wherein a higher dopant concentration in the drift zone 121 results in a lower on-state resistance RDSon of the semiconductor device 500. Reducing the curvature at the bottom of the electrode structures 190 gets along with a simple layout amendment narrowing the end portions 720 of the electrode structures 190 and without additional processes.

Figure 2A:
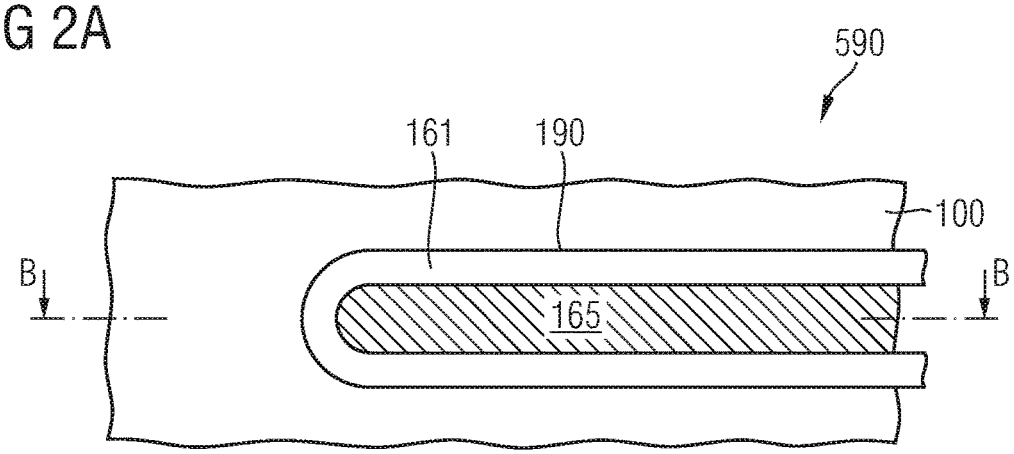
FIG. 2A is a schematic horizontal cross-sectional view of a portion of a semiconductor device according to a reference example for illustrating effects of the embodiments.
Figure 2B:
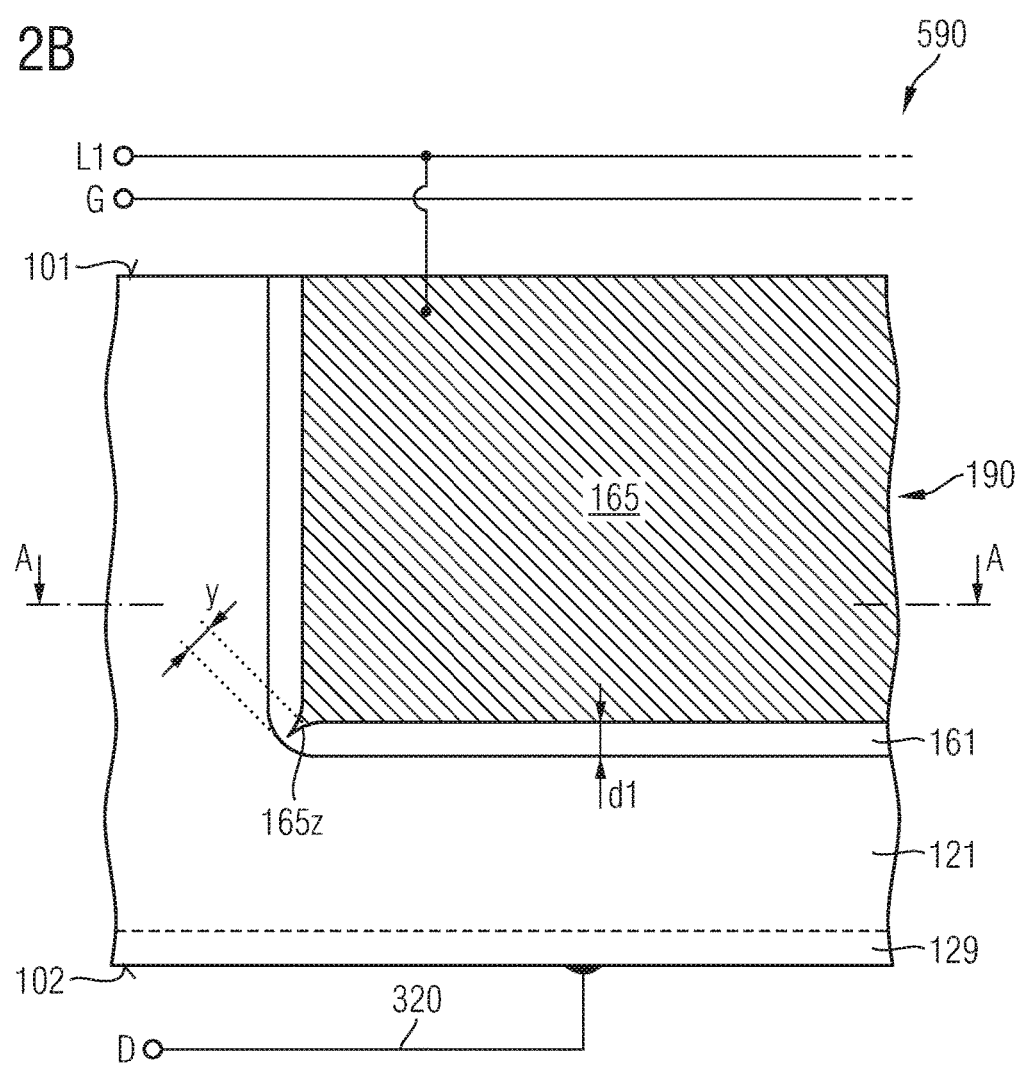
FIG. 2B is a vertical cross-sectional view of the semiconductor device portion of FIG. 2A along line B-B.

FIGS. 2A and 2B refer to a conventional semiconductor device 590 including an electrode structure 190 with the same dimensions and layer configuration as the electrode structure 190 of FIGS. 1A to 1C, but with a conventional, rounded end portion. In a conventional, rounded end portion, a filled section, which is completely filled with the field dielectric 161, has a length equal to the thickness of the field dielectric 161.

In the conventional semiconductor device 590, a field dielectric 161 obtained by thermal growth exhibits a lower growth rate in corners, wherein the locally reduced growth rate results in constrictions of the field dielectric 161 in the corners. A minimum thickness y in the bottom corner at the end of the electrode structure 190 typically is only 75% of the first layer thickness d1 outside the corners. Consequently, a field electrode 165 deposited on the thermally grown field dielectric 161 of FIGS. 2A to 2B includes appendices 165z extending into the hollows of the field dielectric 161 in the corners.

Compared to the conventional semiconductor device 590 of FIGS. 2A to 2B, the field dielectric 161 of a semiconductor device 500 according to the embodiments shows no or less pronounced notches in the corners.

Avoiding such notches and instead ensuring a uniform thickness of the field dielectric 161 also along the bottom corners in the end portions 720 of the electrode structures 190 may allow for reducing the overall first layer thickness d1 of the field dielectric 161 by 20%. Reducing the first layer thickness d1 improves capacitive coupling from the field electrode 165 into adjoining portions of the drift zone 121 and allows for increasing the dopant concentration in the drift zone 121, wherein the increased dopant concentration may result in a reduction of the on-state resistance RDSon by about 5%.

Figure 3A:
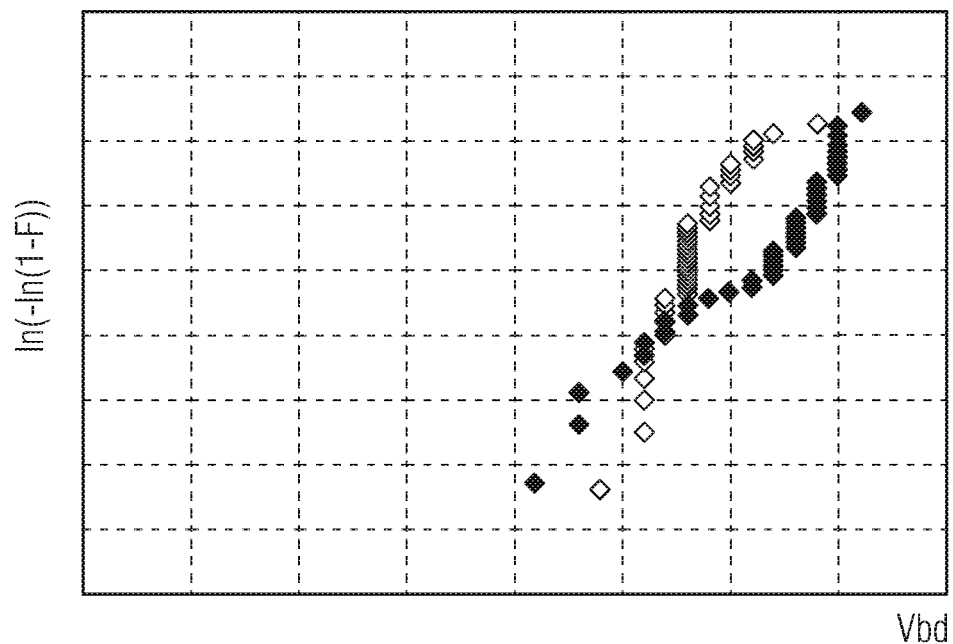
FIG. 3A is a schematic diagram illustrating failure probabilities for both a semiconductor device according to the embodiments and a reference example for discussing effects of the embodiments.

FIG. 3A illustrates Weibull time-to-failure distributions for different breakdown voltages Vbd, wherein the dark diamonds refer to a semiconductor device according to the embodiments and the bright diamonds refer to a comparative example with conventional, rounded end portion as illustrated in FIGS. 2A and 2B. Compared to the comparative example, a maximum value of the failure probability is shifted to higher breakdown voltages and longer time-to-failure periods.

Figure 3B:
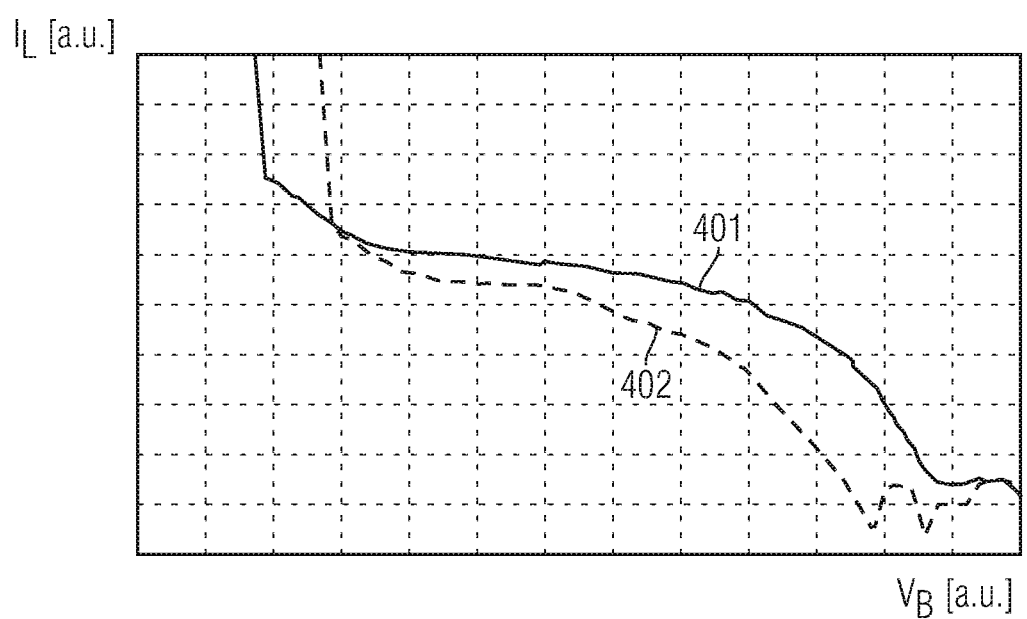
FIG. 3B is a schematic diagram plotting a leakage current against a blocking voltage for both a semiconductor device according to the embodiments and a reference example for discussing effects of the embodiments.

In FIG. 3B curve 401 plots the leakage current against the blocking voltage for a semiconductor device according to the embodiments and curve 402 plots the leakage current 402 against the blocking voltage for a comparative example. For the comparative example, a steep increase of the leakage current indicating a breakdown of the field dielectric 161 occurs yet at a lower absolute value of the blocking voltage.

The electrode structures 190 may exclusively include a field electrode 165. Gate electrodes of the transistor cells TC may be planar gates formed outside the semiconductor portion 100 in a distance to the first surface 101 and controlling an MOS channel parallel to the first surface 101 or may be buried gates extending between neighboring electrode structures 190 from the first surface 101 into mesa sections of the semiconductor portion 100 between neighboring electrode structures 190 and controlling an MOS channel vertical to the first surface 101.

Figure 4A:
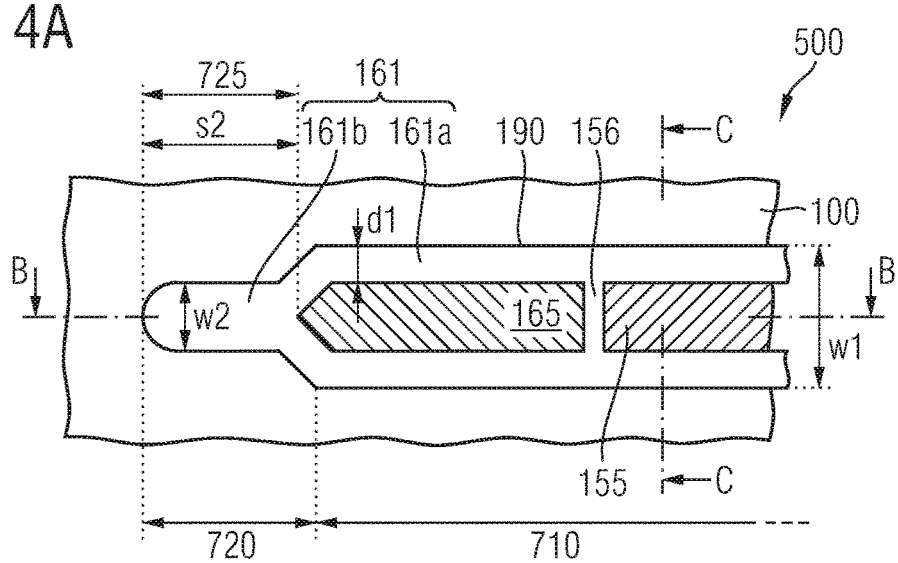
FIG. 4A is a schematic horizontal cross-sectional view of a portion of a semiconductor device according to an embodiment related to electrode structures including gate electrodes.
Figure 4B:
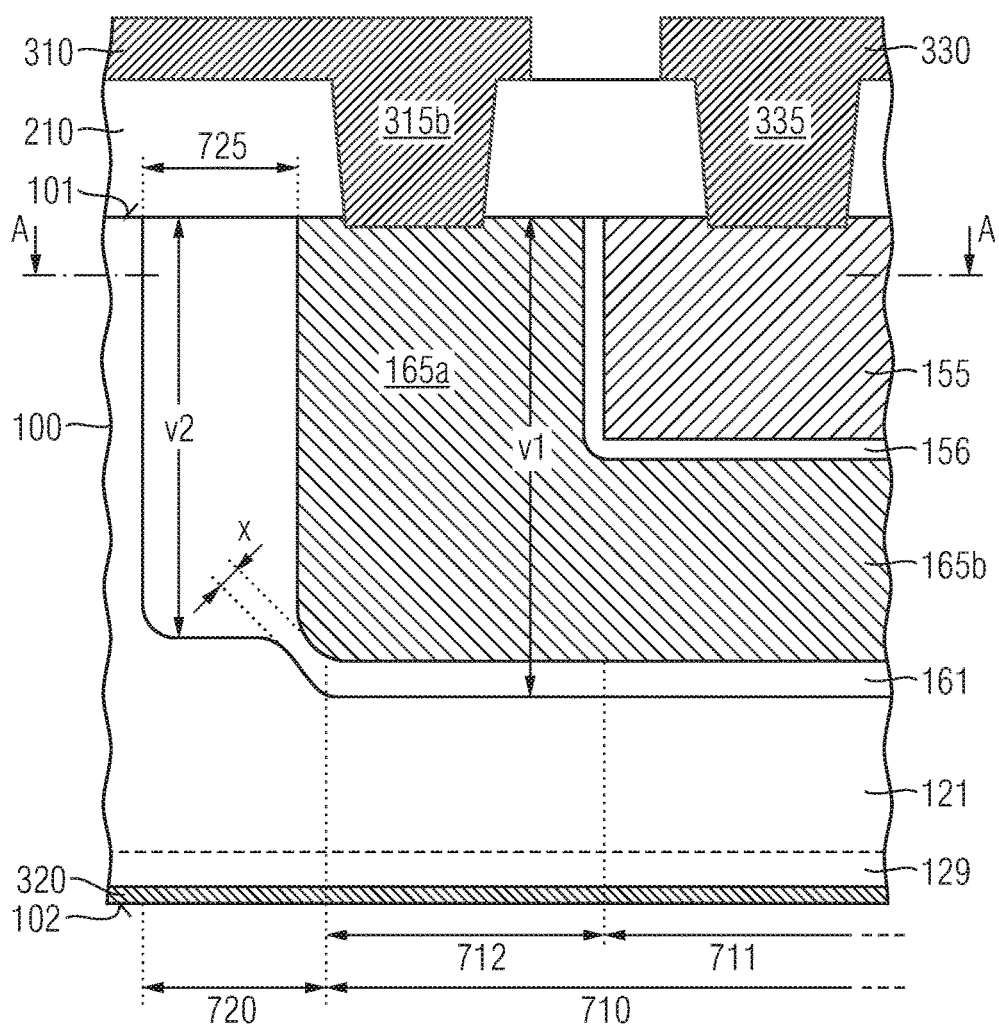
FIG. 4B is a schematic vertical cross-sectional view of the semiconductor device portion of FIG. 4A along line B-B coinciding with a longitudinal center axis of the electrode structure.
Figure 4C:
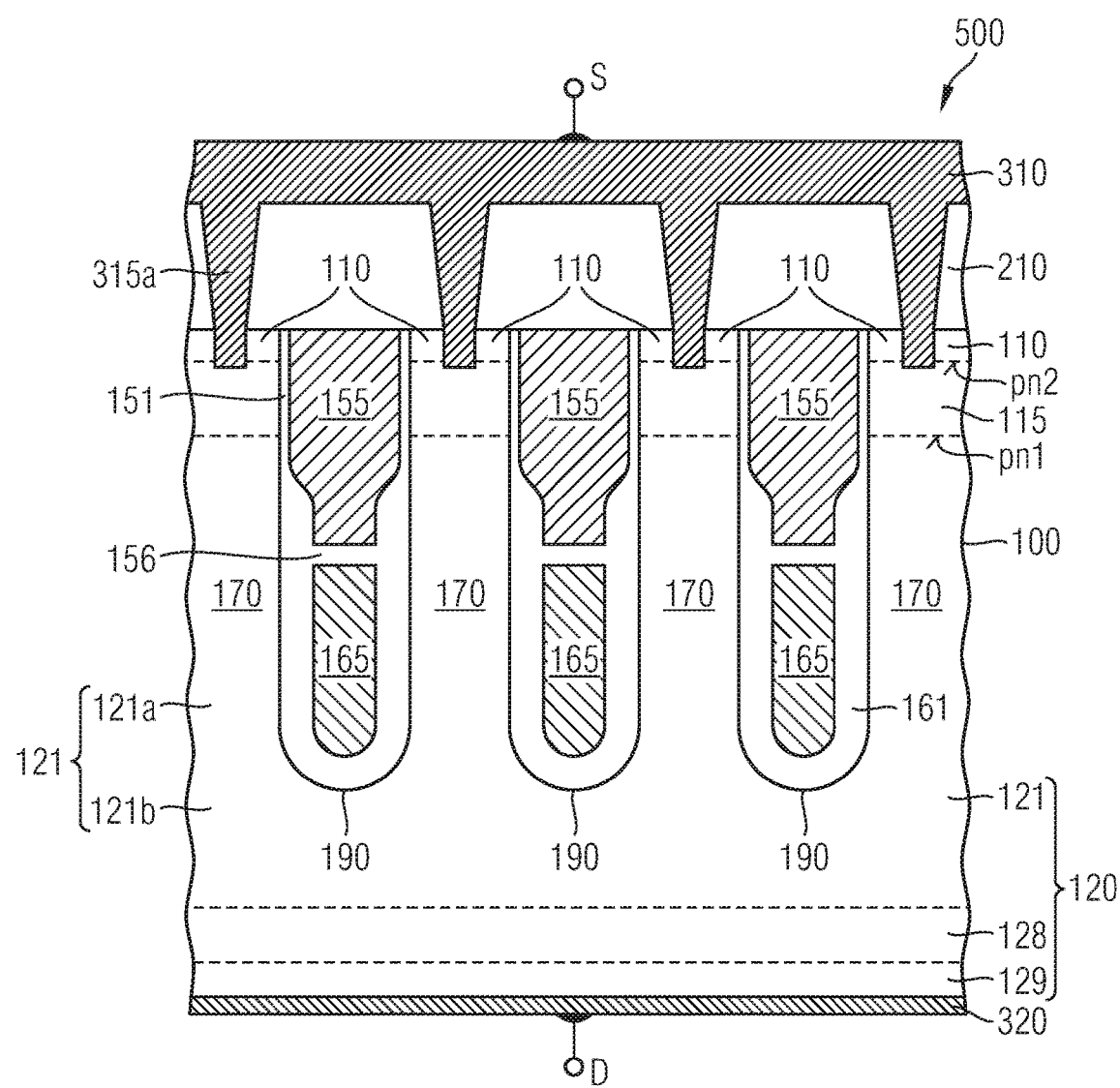
FIG. 4C is a schematic vertical cross-sectional view of the semiconductor device portion of FIG. 4A parallel to line C-C and orthogonal to the longitudinal center axis of the electrode structure.

FIGS. 4A to 4C refer to a semiconductor device 500 with the electrode structures 190 including both the field electrode 165 and the gate electrode 155.

The gate electrode 155 is formed between the first surface 101 and a buried portion 165b of the field electrode 165 in a first section 711 of the main portion 710. The gate electrode 155 may consist of or include heavily doped polycrystalline silicon, metal-containing material(s), or any combination thereof.

A separation dielectric 156 separates the field electrode 165 from the gate electrode 155. The separation dielectric 156 may be thermally grown silicon oxide or a deposited dielectric, for example TEOS silicon oxide, or any combination thereof.

A gate dielectric 151 separates the gate electrode 155 from the semiconductor portion 100. The gate dielectric 151 may consist of or include a thermally grown semiconductor oxide, semiconductor nitride or semiconductor oxynitride, for example thermally grown silicon oxide, a deposited dielectric, for example a deposited silicon nitride or TEOS silicon oxide, or any combination thereof.

The gate electrode 155 is absent in second sections 712 of the main portion 710 where connection portions 165a of the field electrode 165 extend between the first surface 101 and the buried portion 165b of the field electrode 165. With reference to the longitudinal axis, the second sections 712 may be sandwiched between the first sections 711 and the end portions 720 or may be sandwiched between neighboring first sections 711.

Mesa sections 170 of the semiconductor portion 100 between neighboring electrode structures 190 include semiconducting portions of the transistor cells TC. The mesa sections 170 include body zones 115 that form first pn junctions pn1 with the drain structure 120 and second pn junctions pn2 with source zones 110, wherein the body zones 115 separate the source zones 110 from the drain structure 120. The source zones 110 are oriented to the front side and may directly adjoin the first surface 101.

The drain structure 120 is oriented to the back and may directly adjoin the second surface 102. The drain structure 120 includes a drift zone 121 with first drift zone sections 121a in the mesa sections 170 between neighboring electrode structures 190 and with a contiguous second drift zone section 121b between the electrode structures 190 and the second surface 102. A dopant concentration in the drift zone 121 may gradually or in steps increase or decrease with increasing distance to the first surface 101 at least in portions of its vertical extension. According to other embodiments, the dopant concentration in the drift zone 121 may be approximately uniform. A mean net dopant concentration in the drift zone 121 may be between $5E12$ cm$^{-3}$ and $1E15$ cm$^{-3}$, for example in a range from $5E13$ cm$^{-3}$ to $5E14$ cm$^{-3}$. The drift zone 121 may include further doped zones of both conductivity types.

In addition to the drift zone 121, the drain structure 120 includes a contact layer 129 along the second surface 102, wherein a dopant concentration in the contact layer 129 is sufficiently high to form an ohmic contact with a metal directly adjoining the second surface 102. In case the semiconductor portion 100 is based on silicon (Si), along the second surface 102 a dopant concentration in an n-doped contact layer 129 may be at least $1E18$ cm$^{-3}$, for example at least $5E19$ cm$^{-3}$ and in a p-doped contact layer 129 the dopant concentration may be at least $1E16$ cm$^{-3}$, for example at least $5E17$ cm$^{-3}$. A field stop layer 128, which may form unipolar homojunctions both with the drift zone 121 and with the contact layer 129, may separate the drift zone 121 from the contact layer 129. A mean net dopant concentration in the field stop layer 128 may be at least 5 times as high as a mean net dopant concentration in the drift zone 121.

Outside of the semiconductor portion 100 an interlayer dielectric 210 separates the gate electrodes 155 from a first load electrode 310. The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example. The interlayer dielectric 210 may be a homogeneous or layered conformal structure.

The first load electrode 310 may form or may be electrically coupled or connected to a first load terminal, which may be the source terminal S in case the semiconductor device 500 includes power transistor cells TC forming an n-channel IGFET. First contact structures 315a extend through the interlayer dielectric 210 and electrically connect the first load electrode 310 with the source zones 110 and the body zones 115 in the mesa sections 170.

A second load electrode 320, which directly adjoins the second surface 102 and the contact layer 129 may form or may be electrically connected to a second load terminal, which may be the drain terminal D in case the power transistor cells TC form an n-channel IGFET.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Ti, V, Ag, Au, Pt, W, and Pd as main constituent(s), e.g., a silicide, a nitride and/or an alloy.

The gate dielectrics 151 capacitively couple the gate electrode 155 to the body zones 115. When a potential at the gate electrodes 155 exceeds a threshold voltage for n-channel transistor cells TC or falls below a threshold voltage for p-channel transistor cells TC, minority charge carriers in the body zones 115 form inversion channels that connect the source zones 110 with the drain structure 120 and the semiconductor device 500 turns on. In the on-state a load current flows through the semiconductor portion 100 in approximately the vertical direction between the first and second load electrodes 310, 320.

As illustrated in FIG. 4B second contact structures 315*b* may extend through the interlayer dielectric 210 and electrically connect the first load electrode 310 with the field electrode 165. Gate contacts 335 extend through the interlayer dielectric 210 and electrically connect a gate metallization 330, which may be formed in the same plane as the first load electrode 310, with the gate electrode 155. As regards further details, reference is made to the description of FIGS. 1A to 1C.

FIG. 5A shows a region around an edge of a transistor cell field 610 including the transistor cells TC. A termination region 690 devoid of any active transistor cells TC surrounds the transistor cell field 610. Main portions 710 of the electrode structures 190 cross the transistor cell field 610 and extend into the termination region 690. End portions 720 of the electrode structure 190 with the filled sections 725 are completely formed in the termination region 690.

In the illustrated embodiment first sections 711 of the main portions 710 extend into the termination region 690 and gate contact structures 335 electrically connect a gate metallization 330 with the gate electrode 155 in the electrode structures 190. Second contact structures 315*b* in the termination region 690 electrically connect the first load electrode 310 with connection portions of the field electrode 165 in second sections 712 of the electrode structures 190.

Figure 5B:
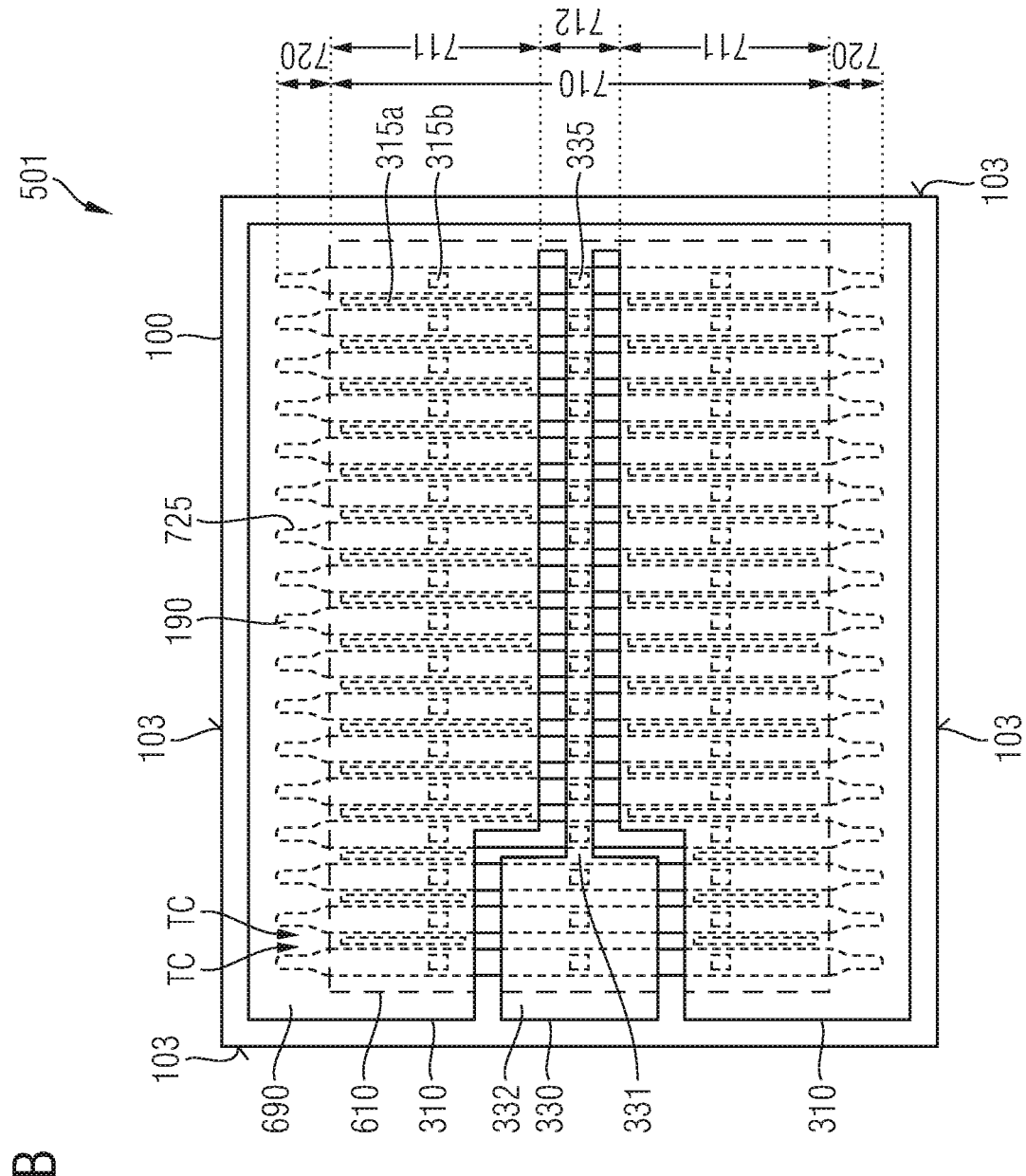
FIG. 5B is a schematic plan view of a power semiconductor device according to an embodiment including a gate finger and a gate pad.
Figure 5C:
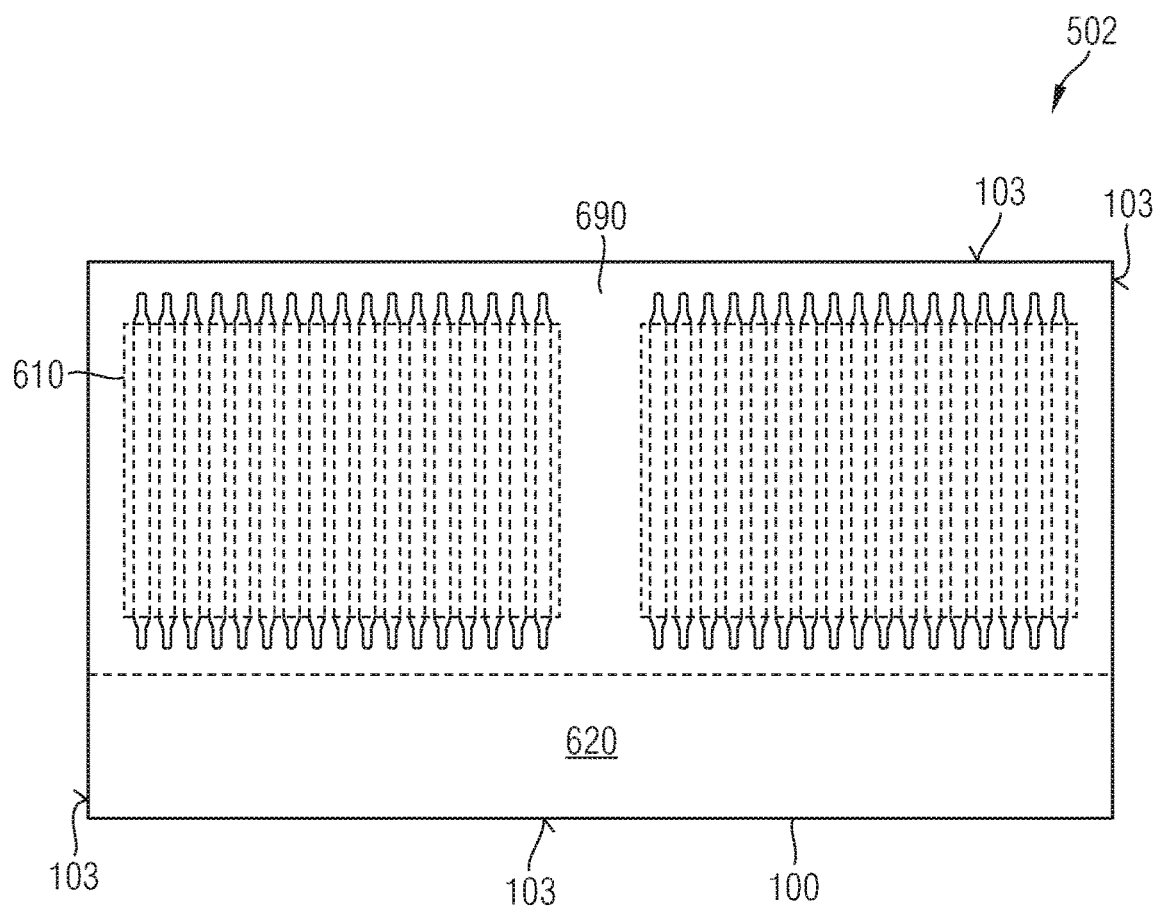
FIG. 5C is a schematic plan view of a smart power semiconductor device including DMOS transistor cell fields and logic circuits.

FIG. 5B refers to an IGFET 501 with a termination portion 690 between a lateral surface 103 and a transistor cell field 610 in which the active transistor cells TC are formed. Both the first load electrode 310 and the gate metallization 330 are formed at the front side of the IGFET 501. The electrode structures 190 extend along a first horizontal direction through the transistor cell area 610. Within the transistor cell area 610 transistor cells TC are formed along the electrode structures 190. The gate metallization 330 includes a gate finger 331 that extends along a second horizontal direction intersecting the first horizontal direction. For example, the gate finger 331 extends orthogonal to the electrode structures 190. Gate contacts 335 extending from the gate finger 331 into the gate electrodes electrically connect the gate electrodes with the gate finger 331. The gate contacts 335 are formed in a second section 712 that separates two neighboring first sections 711 of the electrode structures 190. The gate finger 331 may electrically connect the gate electrodes with each other and with a gate pad 332.

First contact structures 315*a* electrically connect the first load electrode 310 with the source and body zones of the transistor cells TC in the mesa sections 170 between the electrode structures 190. Second contact structures 315*b* which may be separated from the first contact structures 315*a* or which may directly adjoin the first contact structures 315*a* electrically connect the field electrode 165 with the first load electrode 310.

The smart power device 502 of FIG. 5B includes two transistor cell fields 610 and a support area 620 that may include a signal processing unit, for example a logic circuit, a sense circuit, a control circuit, or a driver circuit such as a gate driver circuit. The smart IGFET 502 may integrate transistors in DMOS and CMOS (complementary metal oxide semiconductor) technology and may be a smart low-side or high-side switch or a smart power IC (integrated circuit), e.g. a multi-channel switch or a CAN (controller area network) transceiver.

In the smart power device 502 of FIG. 5B termination portions 690 separates the transistor cell field 610 from each other, from the lateral surface 103, and from the support area 620.

FIGS. 6A to 6E refer to details of embodiments of the filled section 725 of the electrode structure 190. The end portion 720 including the filled section 725 may be a narrowed extension of the main portion 710, wherein the extension is symmetric to a longitudinal center axis of the electrode structure 190.

Each end portion 720 consists of or includes a filled section 725, wherein a contour of the filled section 725 may include straight portions parallel to the longitudinal axis on both long sides of the electrode structure 190.

Figure 6A:
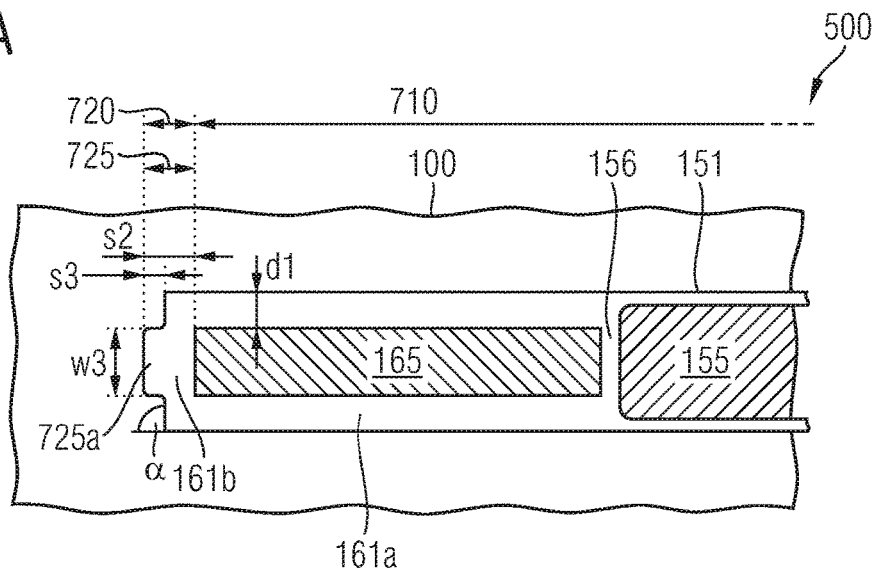
FIG. 6A is a schematic horizontal cross-sectional view of a portion of a semiconductor device according to an embodiment concerning end portions with filled sections including short narrow portions.
Figure 6B:
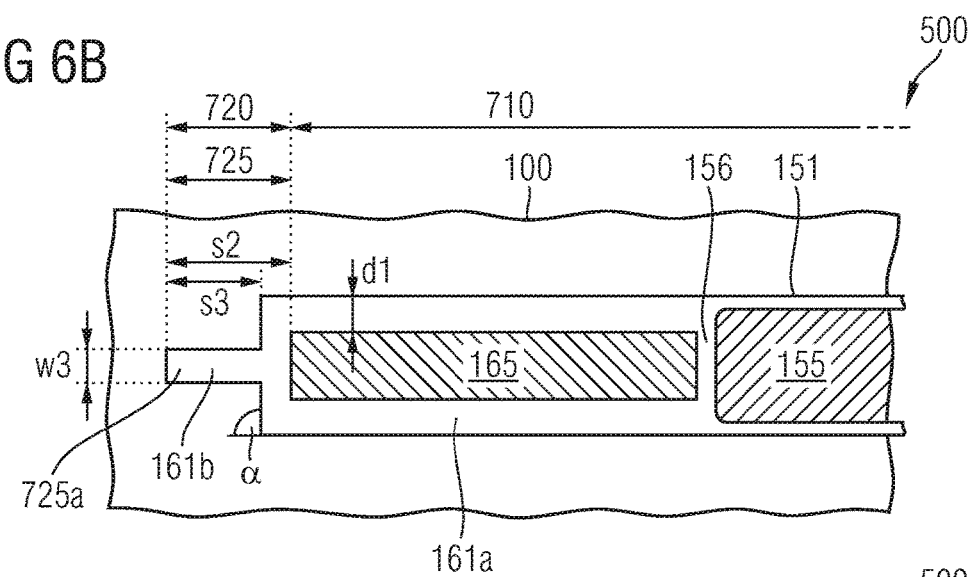
FIG. 6B is a schematic horizontal cross-sectional view of a portion of a semiconductor device according to an embodiment concerning end portions with filled sections including long narrow portions.

FIGS. 6A and 6B refer to embodiments with the filled section 725 including a rectangular step between the width w1 of the main portion 710 and a width w3 of a narrow section 725*a* of uniform width. The third width w3 of the narrow section 725*a* is smaller than the first width w1 of the main portion 710 and may be about twice the first layer thickness d1 of the field dielectric 161 in the main portion 710. A length s3 of the narrow section 725*a* is at least 50% of the first layer thickness d1 and a total length s2 of the filled section 725 is at least 150%, e.g., at least 200% or at least 300% of the first layer thickness d1.

In FIG. 6B the third width w3 of the narrow section is in the range of the first layer thickness d1 of the field dielectric 161 in the main portion 710.

Figure 6C:
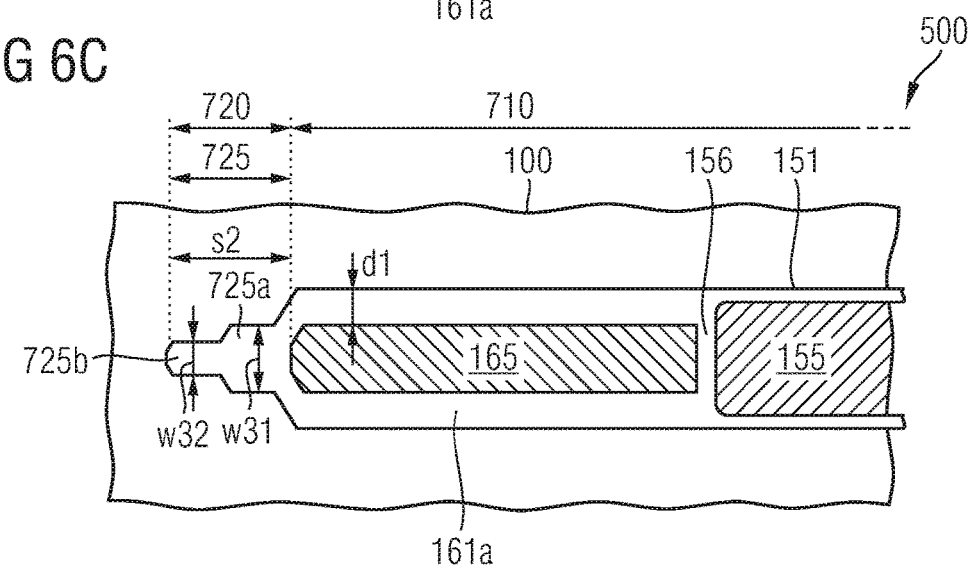
FIG. 6C is a schematic cross-sectional view of a portion of a semiconductor device according to an embodiment concerning end portions with stepped filled sections.

In FIG. 6C the filled section 725 includes a first narrow section 725*a* directly adjoining the main portion 710 with a width w31 and a second narrow section 725*b* with a width w32 smaller than the width w31 of the first narrow section 725*a*. According to other embodiment, the filled sections 725 may include further narrow sections with widths different from w31 and w32.

Figure 6D:
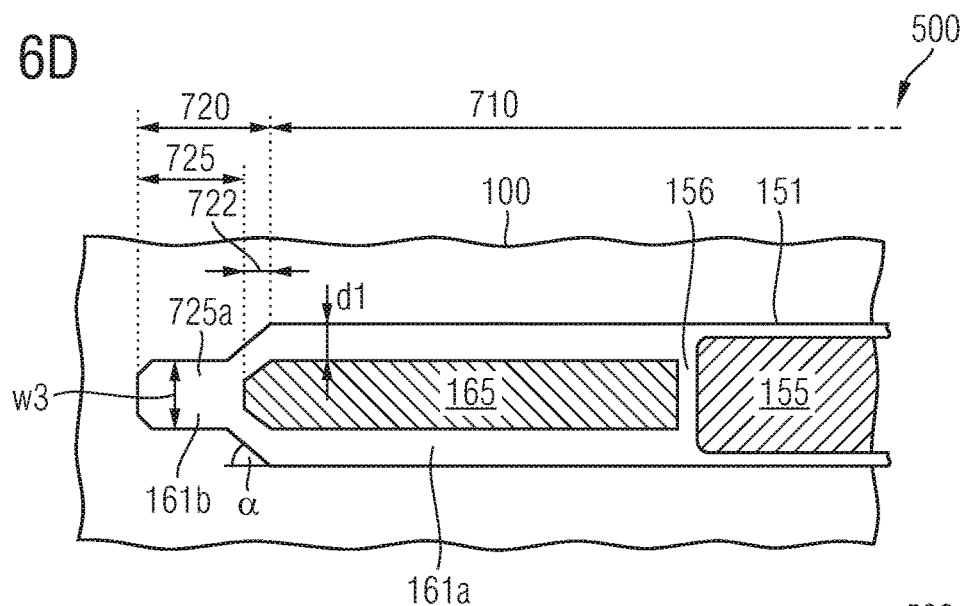
FIG. 6D is a schematic horizontal cross-sectional view of a portion of a semiconductor device according to an embodiment concerning end portions with filled sections including tapering sections between narrow sections and the main portions.

FIG. 6D shows an end portion 720 that includes a tapering section 722, in which the width of the electrode structure 190 gradually tapers from the first width w1 of the main portion 710 to a width w3 of a narrow section 725*a* of the filled section 725. The tapering section 722 may be linear and a contour line in the tapering section 722 may have an angle α of about 45° with respect to the longitudinal axis. According to other embodiments, the contour line of the tapering section 722 may be bowed.

The end face of the end portion 720 may be orthogonal to the longitudinal axis, may be bowed or may have beveled edges as shown in FIG. 6D.

Figure 6E:
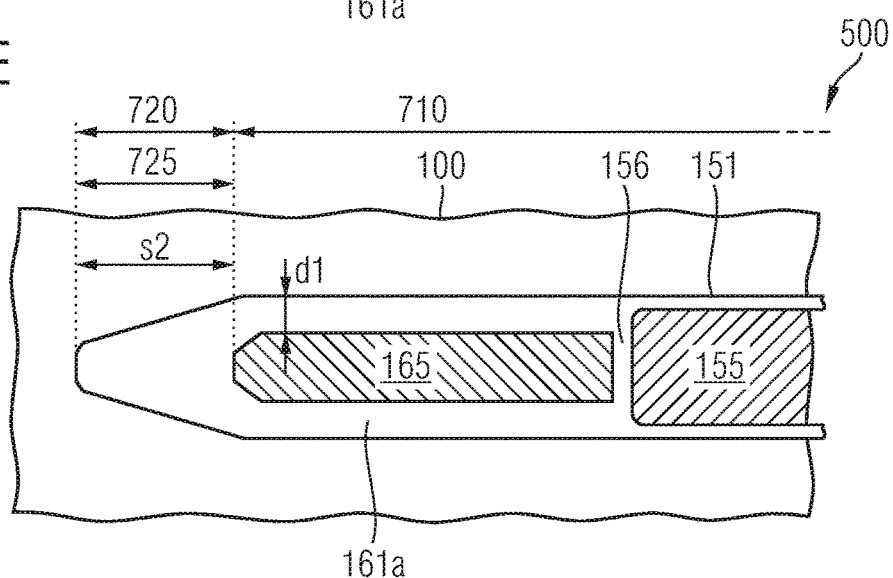
FIG. 6E is a schematic horizontal cross-sectional view of a portion of a semiconductor device according to an embodiment concerning end portions with steadily tapering sections.

FIG. 6E refers to an embodiment with a curved outline of a steadily tapering end portion 720 including a filled section 725 that tapers with increasing distance to the main portion 710.

Figure 6F:
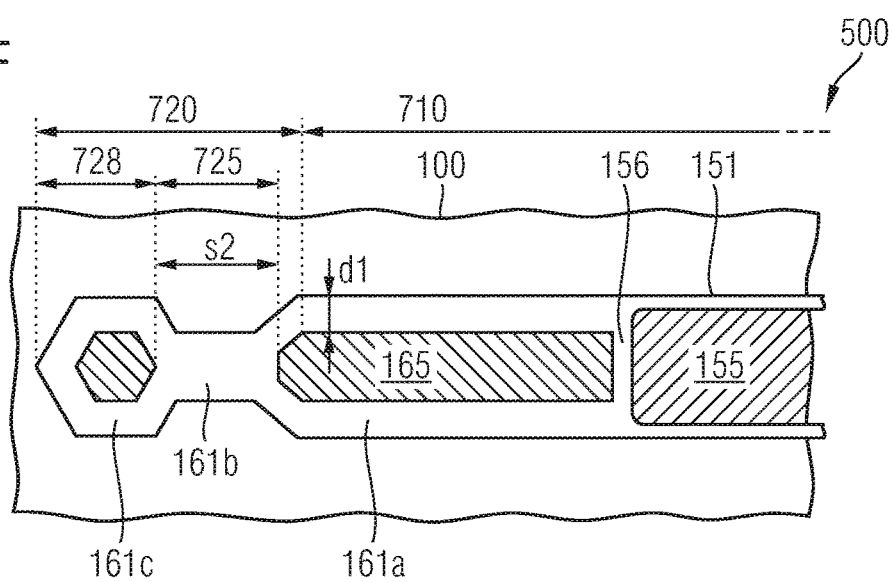
FIG. 6F is a schematic horizontal cross-sectional view of a portion of a semiconductor device according to an embodiment concerning end portions with filled and expanded sections.

The semiconductor device 500 of FIG. 6F shows an end section 720 that includes an expanded section 728 at a side of the filled section 725 opposite to the main portion 710. The expanded section 728 may include a further portion 161c of the field dielectric 161 as well as a conductive material, for example a field plate electrically connected to a source potential or to a potential between the source and the drain potential.

Figure 7A:
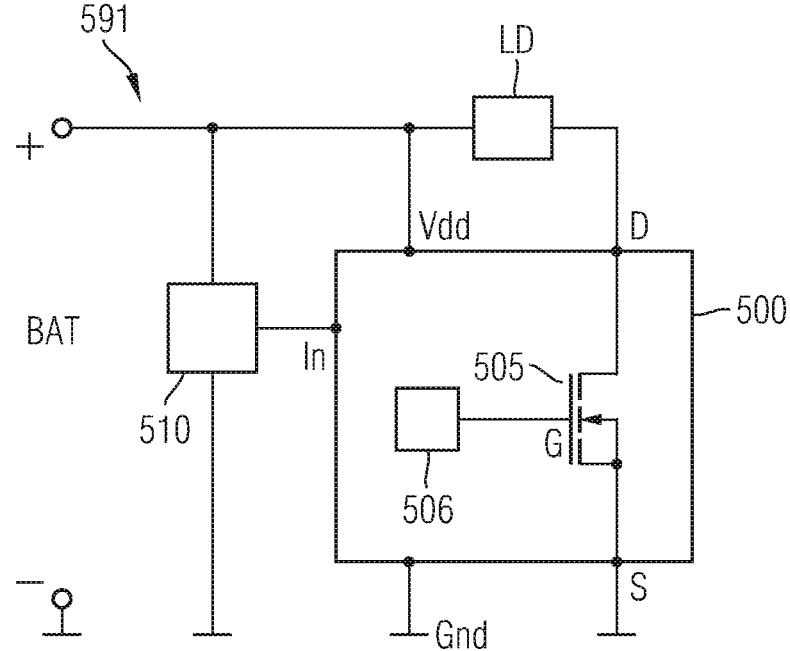
FIG. 7A is a schematic circuit diagram of an electronic circuit including a smart FET (field effect transistor) according to an embodiment.

FIG. 7A refers to an electronic circuit 591 including a semiconductor device 500 as described in the previous figures. The semiconductor device 500 may be a smart FET usable as a low-side switch and including a power FET 505 and a signal processing circuit 506. A drain terminal D is electrically connected to a drain electrode of the power FET 505 and may be electrically connected or coupled to a load LD which may be a motor winding, a coil or a transformer winding, by way of example. The load LD is electrically arranged in series between the anode of a battery BAT and the drain terminal D. A source terminal S of the semiconductor device 500 is electrically connected to a source electrode of the power FET 505 and may be electrically connected or coupled to a cathode of the battery BAT. Further power terminals Vdd, Gnd may provide the supply voltage for the internal signal processing circuit 506. A gate control circuit 510 may be electrically connected to an input terminal IN and may supply a signal for controlling the switching cycle of the semiconductor device 500.

The power FET 505 includes a microcell power transistor in a DMOS portion of the semiconductor device 500 as described with reference to the previous FIGS. The signal processing circuit 506 includes transistors of another technology, e.g., CMOS transistors, low-voltage FETs, lateral high-voltage FETs and/or bipolar transistors in a further portion, e.g., a CMOS portion. The signal processing circuit 506 may provide overvoltage protection, ESD protection, current limitation, overload protection and/or short-circuit protection, by way of example. Other embodiments refer to smart high-side switches.

Figure 7B:
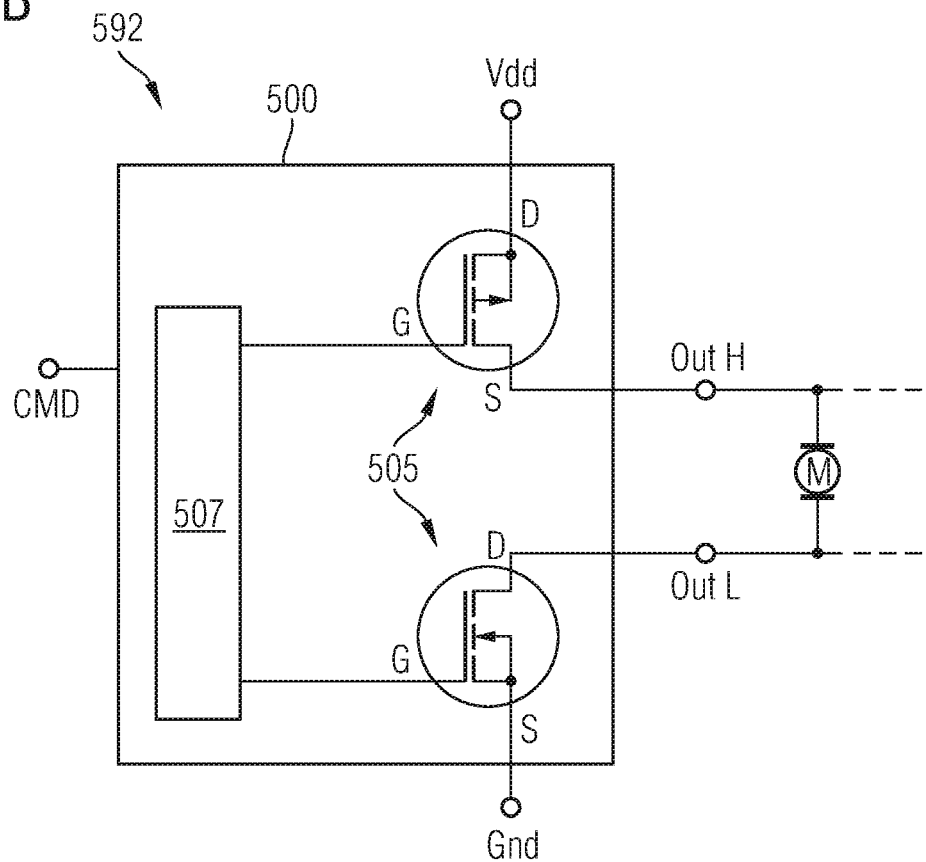
FIG. 7B is a schematic circuit diagram of an electronic circuit including a half-bridge circuit according to a further embodiment.

In the electronic circuit 592 of FIG. 7B a semiconductor device 500 as described with reference to the previous FIGS. is a monolithically integrated half-bridge circuit and includes two power FETs 505 and a signal processing circuit 507. The source of the high-side switch is connected to a high-side output terminal OutH and the drain of the low-side switch is connected to a low-side output terminal OutL. A motor winding may be electrically arranged between the high-side output terminal OutH and the low-side output terminal OutL. The signal processing circuit 507 may provide pulse width modulation, gate driving, overvoltage protection, ESD protection, current limitation, overload protection and/or short-circuit protection, by way of example, and may be controlled by a signal applied to a control input CMD.

FIGS. 8A to 8D refer to a method of manufacturing a semiconductor device according to an embodiment filling the filled section with deposited oxide and forming the field dielectric in the main portion 710 by a thermal oxidation of silicon.

Figure 8A:
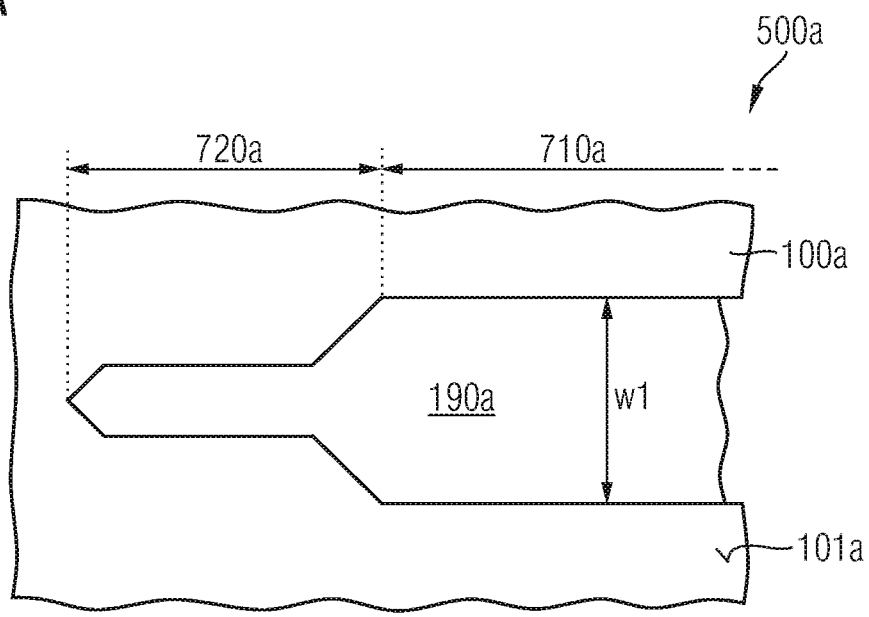
FIG. 8A is a schematic horizontal cross-sectional view of a method of manufacturing a semiconductor device according to an embodiment, after forming trenches.

FIG. 8A shows a semiconductor substrate 500a consisting of or containing a semiconductor layer 100a of a single-crystalline semiconductor material. The semiconductor substrate 500a may be a semiconductor wafer from which a plurality of identical semiconductor dies is obtained. The semiconductor material of the semiconductor layer 100a may be silicon (Si), silicon carbide (SiC), germanium (Ge), a silicon germanium crystal (SiGe), gallium nitride (GaN) or gallium arsenide (GaAs) or any other $Au_{III}B_{IV}$ semiconductor, by way of example.

A perpendicular to a main surface 101a of the semiconductor layer 100a defines a vertical direction and directions orthogonal to the vertical direction are horizontal directions.

From the main surface 101a trenches 190a are etched into the semiconductor layer 100a by using an etch process, wherein a local etch rate in the trench 190a depends on a local width of the trench 190a, e.g., a reactive ion beam etch process.

FIG. 8A is a horizontal cross-sectional view of a semiconductor layer 100a and a trench 190a with a main portion 710a of uniform width and an end portion 720a in which the width decreases. A vertical extension of the trench 190a may be in a range from 1 to 10 µm, for example from 3 to 5 µm. A horizontal width w1 of the main portion 710a of the trench 190a may be in a range from 0.2 to 2 µm, for example in a range from 0.8 to 1.0 µm. The trench 190a is stripe-shaped and extends into a first horizontal direction. A conformal dielectric layer 260a of uniform layer thickness is deposited, for example by CVD on the basis of TEOS or ozone-assisted TEOS CVD.

Figure 8B:
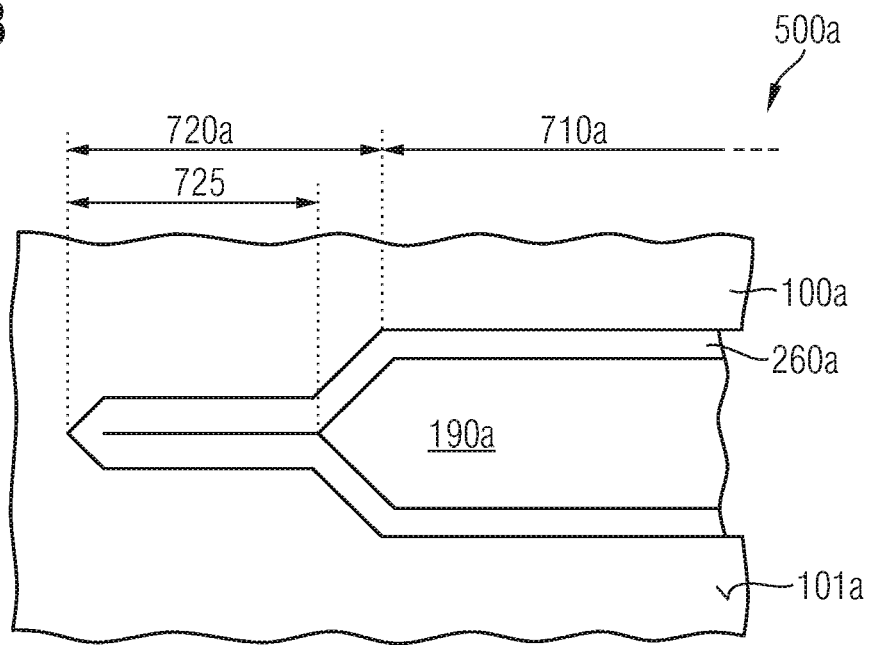
FIG. 8B is a schematic cross-sectional view of the semiconductor substrate portion of FIG. 8A, after depositing a conformal dielectric layer.

As shown in FIG. 8B the conformal dielectric layer 260a completely fills a filled section 725 and covers at uniform thickness the sidewalls of the main portion 710.

A mask layer is deposited and patterned by lithography to form an etch mask 910 covering the filled section 725 and exposing the main portion 710. An etch process selectively removes a first portion of the conformal dielectric layer 260a in the main portion 710.

Figure 8C:
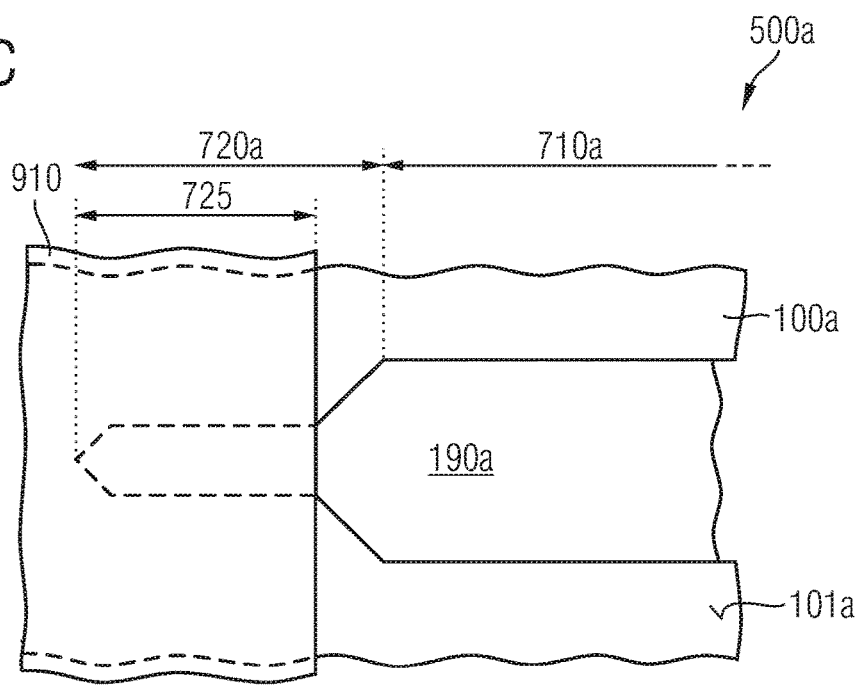
FIG. 8C is a schematic cross-sectional view of the semiconductor substrate portion of FIG. 8B, after removing a portion of the conformal dielectric layer in a main portion.

FIG. 8C shows the etch mask 910 covering the filled section 725 and a second portion of the conformal dielectric layer 260a in the filled section 725.

The etch mask 910 may be removed. A thermal oxide layer may be grown on the exposed sidewalls of the trench 190a in the main portion 710. Conductive material may be deposited into the trench 190a to form a field electrode 165.

Figure 8D:
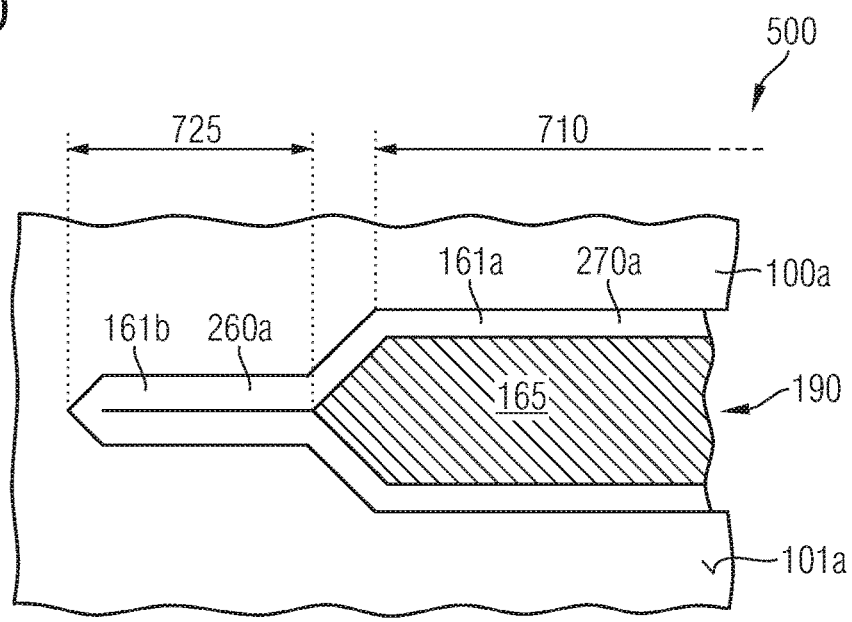
FIG. 8D is a schematic cross-sectional view of the semiconductor substrate portion of FIG. 8C, after a thermal oxidation and after depositing a conductive material.

FIG. 8D shows an electrode structure 190 with the thermal oxide 270a covering the sidewalls of the trench 190a and forming first portions 161a of a field dielectric 161 in the main portion 710. The remnant second portions of the conformal dielectric layer 260a in the filled section 725 form second portions 161b of the field dielectric 161 in the filled section 725.

The conformal dielectric layer 260a may be deposited at a thickness greater than the target thickness of the first portion 161a of the field dielectric 161 in the main portion 710. In addition, the method suppresses the formation of polycrystalline silicon fingers that otherwise may extend from the main portion 710 into the filled section 725 and that may adversely affect the reliability of the field dielectric 161.

Further, the two-step-approach allows for decoupling the thickness of the filled section 725 from a target thickness of the field dielectric 161. In the main portion 710 the thermally grown oxide layer ensures high quality and reliability.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a stripe-shaped electrode structure extending from a first surface into a semiconductor portion, wherein the electrode structure comprises a main portion and an end portion terminating the electrode structure,
wherein the main portion comprises a field electrode and a first portion of a field dielectric separating the field electrode from the semiconductor portion,
wherein the end portion comprises a filled section in which a second portion of the field dielectric extends from a first side of the electrode structure to an opposite second side,
wherein the filled section is narrower than the main portion and a length of the filled section along a longitudinal axis of the electrode structure is at least 150% of a first layer thickness of the first portion of the field dielectric,
wherein the end portion is devoid of a gate electrode and a gate contact.

2. The semiconductor device of claim 1, wherein the filled section comprises a narrow section of uniform width and narrower than the main portion.

3. The semiconductor device of claim 2, wherein a width of the narrow section is at most twice the first layer thickness of the first portion of the field dielectric in the main portion.

4. The semiconductor device of claim 1, wherein the end portion includes a tapering section sandwiched between the filled section and the main portion, and a width of the tapering section continuously decreases from the main portion to the filled portion.

5. The semiconductor device of claim 1, wherein the end portion includes an expanded section directly adjoining the filled section at a side opposite to the main portion, wherein a width of the expanded section is greater than a width of the filled section.

6. The semiconductor device of claim 1, wherein with respect to the first surface, a vertical extension of the filled section is smaller than a vertical extension of the electrode structure in the main portion.

7. The semiconductor device of claim 1, wherein the field dielectric comprises a thermally grown layer directly adjoining the semiconductor portion.

8. The semiconductor device of claim 1, wherein the filled section tapers with increasing distance to the main portion.

9. The semiconductor device of claim 1, wherein the main portion comprises a gate electrode and a separation dielectric separating the gate electrode and the field electrode.

10. The semiconductor device of claim 9, further comprising a signal processing circuit electrically connected or coupled to the gate electrode.

11. The semiconductor device of claim 1, wherein the semiconductor portion includes transistor cells that comprise body zones forming first pn junctions with a drift zone and second pn junctions with source zones, and wherein the body zones separate the drift zone from the source zones.

12. The semiconductor device of claim 11, wherein the body zones and the source zones are formed in mesa sections between the electrode structures and wherein the electrode structures extend into the drift zone.

13. The semiconductor device of claim 1, wherein a length of the filled section along the longitudinal axis of the electrode structure is at least 200% of the first layer thickness.

14. An electronic circuit, comprising:
a semiconductor device comprising:
a stripe-shaped electrode structure extending from a first surface into a semiconductor portion, wherein the electrode structure comprises a main portion and an end portion terminating the electrode structure,
wherein the main portion comprises a field electrode and a first portion of a field dielectric separating the field electrode from the semiconductor portion,
wherein the end portion comprises a filled section in which a second portion of the field dielectric extends from a first side of the electrode structure to an opposite second side,
wherein the filled section is narrower than the main portion and a length of the filled section along a longitudinal axis of the electrode structure is at least 150% of a first layer thickness of the first portion of the field dielectric,
wherein the end portion is devoid of a gate electrode and a gate contact; and
a load electrically coupled to a load electrode of the semiconductor device.

15. The electronic circuit of claim 14, further comprising a gate control circuit electrically connected or coupled to an input terminal of the semiconductor device and configured to control a switching cycle of the semiconductor device.

16. The semiconductor device of claim 1, wherein the end portion is occupied entirely by the second portion of the field dielectric so that the end portion is devoid of electrically conductive material.

17. The semiconductor device of claim 4, wherein the field electrode extends into and narrows within the tapering section.

18. The semiconductor device of claim 5, wherein the expanded section includes a conductive material.

19. The semiconductor device of claim 5, wherein the end portion includes a first tapering section sandwiched between the filled section and the main portion and a second tapering section sandwiched between the filled section and the expanded section, wherein a width of the first tapering section continuously decreases from the main portion to the filled portion, and wherein a width of the second tapering section continuously increases from the filled portion to the expanded section.

20. The semiconductor device of claim 19, wherein the field electrode extends into and narrows within the first tapering section.

21. The semiconductor device of claim 1, wherein the main portion extends deeper into the semiconductor portion than the end portion.

* * * * *